United States Patent
Dutta et al.

(10) Patent No.: US 11,380,678 B2
(45) Date of Patent: Jul. 5, 2022

(54) METAMORPHIC HIGH ELECTRON MOBILITY TRANSISTOR-HETEROJUNCTION BIPOLAR TRANSISTOR INTEGRATION

(71) Applicant: QUALCOMM Incorporated, San Diego, CA (US)

(72) Inventors: Ranadeep Dutta, Del Mar, CA (US); Je-Hsiung Lan, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/899,811

(22) Filed: Jun. 12, 2020

(65) Prior Publication Data

US 2021/0391321 A1 Dec. 16, 2021

(51) Int. Cl.
*H01L 27/06* (2006.01)
*H01L 21/8252* (2006.01)
*H01L 29/66* (2006.01)

(52) U.S. Cl.
CPC ...... *H01L 27/0623* (2013.01); *H01L 21/8252* (2013.01); *H01L 27/0605* (2013.01); *H01L 29/66318* (2013.01); *H01L 29/66462* (2013.01)

(58) Field of Classification Search
CPC ............ H01L 27/0605; H01L 27/0623; H01L 21/8252; H01L 21/8258; H01L 29/7785; H01L 29/7786; H01L 29/7371; H01L 29/66318; H01L 29/66462; H01L 27/0635; H01L 27/0716; H01L 27/0711–0722; H01L 27/0722
See application file for complete search history.

(56) References Cited

U.S. PATENT DOCUMENTS

| | | | | |
|---|---|---|---|---|
| 6,465,289 B1* | 10/2002 | Streit | ................. | H01L 21/8252 257/E21.697 |
| 2007/0090399 A1* | 4/2007 | Chin | ................... | H01L 29/7785 257/197 |
| 2012/0175681 A1* | 7/2012 | Stevens | ................. | H01L 29/737 257/195 |
| 2015/0054036 A1* | 2/2015 | Yang | ..................... | H01L 23/642 257/195 |

OTHER PUBLICATIONS

L. Tran et al., "Monolithic integration of InP HBT and HEMT by selective molecular beam epitaxy," Proceedings of 8th International Conference on Indium Phosphide and Related Materials, 1996, pp. 76-78, doi: 10.1109/ICIPRM.1996.491938. (Year: 1996).*
W. Ha et al., "High performance monolithic InP HBT-HEMT integration," 2009 Device Research Conference, 2009, pp. 163-164, doi: 10.1109/DRC.2009.5354966. (Year: 2009).*

* cited by examiner

*Primary Examiner* — John P. Dulka
(74) *Attorney, Agent, or Firm* — Patterson+ Sheridan, L.L.P.

(57) ABSTRACT

A semiconductor device having metamorphic high electron mobility transistor (HEMT)-heterojunction bipolar transistor (HBT) integration on a semiconductor substrate. An example semiconductor device generally includes a semiconductor substrate, a bipolar junction transistor (BJT) disposed above the semiconductor substrate and comprising indium, and a HEMT disposed above the semiconductor substrate and comprising indium.

20 Claims, 12 Drawing Sheets

METAMORPHIC HIGH ELECTRON MOBILITY TRANSISTOR-HETEROJUNCTION BIPOLAR TRANSISTOR INTEGRATION

BACKGROUND

Field of the Disclosure

Certain aspects of the present disclosure generally relate to electronic circuits and, more particularly, to a semiconductor device having a high electron mobility transistor (HEMT) and a heterojunction transistor (HBT) integrated on the same silicon substrate and a method of fabricating such a semiconductor device.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Many of the semiconductor devices that are contemporaneously being created are aimed at processing digital data. There are, however, also numerous semiconductor designs that are aimed at incorporating analog functions into devices that simultaneously process digital and analog signals, or devices that can be used for the processing of only analog signals.

An example of a semiconductor device that may incorporate analog and digital functions is a radio frequency front-end. A wireless communication device, such as a base station or user equipment, may include a radio frequency front-end for transmitting and/or receiving radio frequency signals. The radio frequency front-end may include transistors to implement various analog and digital devices, such as control circuitry, switches, duplexers, diplexers, multiplexers, power amplifiers, low noise amplifiers, mixers, etc. The devices implemented with transistors may be fabricated on a semiconductor wafer. Some of the transistor devices (such as a power amplifier) may be fabricated as discrete components and interconnected to the other devices of the radio frequency front-end.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include a semiconductor device that provides desirable thermal conductivity, fabrication cycle times, and radio frequency (RF) performance for switches, power amplifiers, low noise amplifiers, and/or phase shifters.

Certain aspects of the present disclosure provide a semiconductor device. The semiconductor device generally includes a semiconductor substrate, a bipolar junction transistor (BJT) disposed above the semiconductor substrate and comprising indium, and a high electron mobility transistor (HEMT) disposed above the semiconductor substrate and comprising indium.

Certain aspects of the present disclosure provide a method of fabricating a semiconductor device. The method generally includes forming a semiconductor stack structure above a semiconductor substrate, forming a bipolar junction transistor (BJT) above the semiconductor stack structure, and forming a high electron mobility transistor (HEMT) from the semiconductor stack structure. In aspects, the semiconductor stack structure comprises indium, and the BJT comprises indium.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
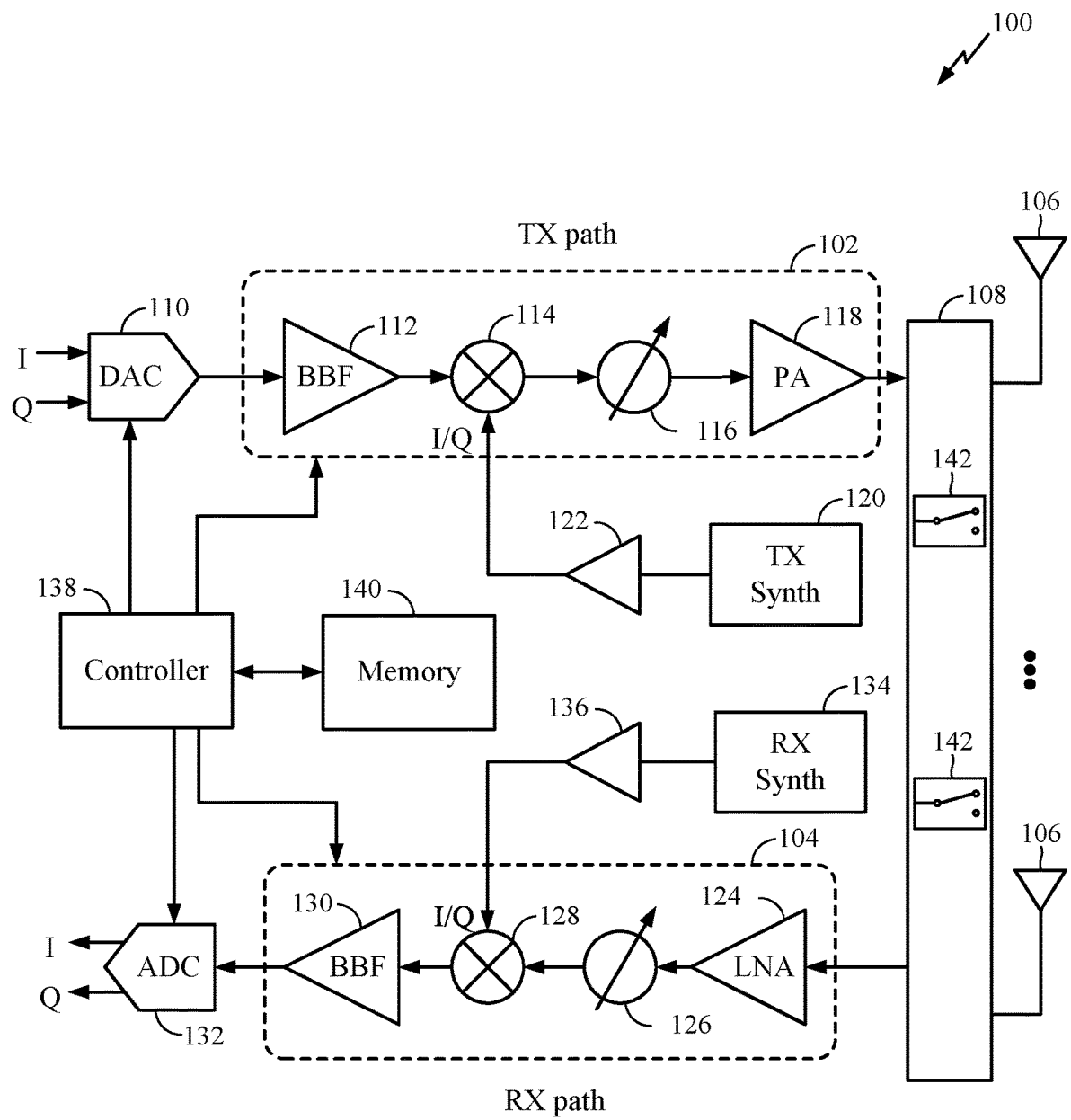
FIG. 1 is a block diagram showing an example radio frequency transceiver, in accordance with certain aspects of the present disclosure.

Aspects of the present disclosure generally relate to a semiconductor device (such as a radio frequency front-end integrated circuit (RFFE IC)) having a high electron mobility transistor (HEMT) and a heterojunction transistor (HBT) integrated on the same silicon substrate and a method of fabricating such a semiconductor device.

An RF transceiver (also referred to as an RF front-end) may include various electronic components such as control logic, switches, digital circuits, low noise amplifiers (LNAs), power amplifiers (PAs), phase shifters, filters, etc. In certain cases, the RF transceiver may have a metamorphic high electron mobility transistor (mHEMT) and metamorphic heterojunction bipolar transistor (mHBT), for example, where the mHEMT may be used for an RF switch or LNA, and the mHBT may be used for a PA or for frequency generation and/or conversion. The mHEMT and mHBT may be processed on separate gallium arsenide (GaAs) substrates. That is, discrete mHEMTs and mHBTs are fabricated separately on different epitaxial stacks, which are grown on different GaAs wafers, and in certain cases at significant cost and cycle times. A GaAs substrate also may suffer from undesirable thermal conductivity, which may result in significant self-heating on high density components. The discrete components on the RF transceiver may lead to high parasitic resistances, inductances, and/or capacitances, resulting in significant parasitic losses, especially at 5G New Radio wireless access bands (such as sub-7 GHz (e.g., 410-7125 MHz) bands and/or mmWave bands (e.g., 24-52.6 GHz or 52.6-100 GHz or beyond)).

Certain aspects of the present disclosure generally relate to a semiconductor device (such as an RF transceiver integrated circuit) having mHEMT and mHBT integrated on the same silicon substrate and a method of fabricating such a semiconductor device. For example, a semiconductor device may have an indium-based HBT and an indium-based HEMT integrated on the same silicon substrate. In certain cases, a group III-V semiconductor epitaxy stack may be grown on a silicon substrate (e.g., a 300 mm silicon wafer) to enable co-integration of an indium phosphide (InP) HEMT and InP HBT with large indium content (e.g., between 30% and 53%). The co-integration of the InP HEMT and InP HBT may enable a 5G RF transceiver system on a single chip, with devices selected for desirable performance, such as an InP HBT for power amplifiers and/or frequency generation and conversion circuits (e.g., a frequency synthesizer, frequency mixer, upconverter, downconverter, etc.), and an InP HEMT for an LNA, alongside complementary metal-oxide-semiconductor (CMOS)-based control logic, digital devices, and/or switches.

Monolithic co-integration of the double HBT (DHBT) and mHEMT on a large area silicon substrate described herein may enable desirable thermal conductivity, desirable cycle time in fabrication, and integration with Si-based devices (such as CMOS-based control logic, digital devices, and/or switches). For example, the silicon substrate may provide desirable thermal conductivity, while the InP HEMT and InP HBT may provide desirable performance for high voltage and high speed transceiver applications. In certain aspects, the co-integration of the InP HEMT and InP HBT may provide cost benefits and cycle time benefits because the fabrication process may be carried out in a single fabrication facility. In certain cases, the co-integration of the InP HEMT and InP HBT may provide a desirable module size and reduce parasitics to enable operation at high frequency bands (such as the mmWave frequency bands).

As used herein, high voltage applications may include operating electronic components (such as the example HEMT described herein) at voltages significantly higher than digital power supply rails, for example, for maximizing power delivered by an RF PA to an antenna (output power may be proportional to the square of the voltage). A high speed device generally refers to a device that has sufficiently high transition frequency ($f_T$) and maximum frequency ($f_{max}$) (e.g., typically 3 to 10 times the operating frequency) to ensure good performance (e.g., output power, gain, efficiency) at the operating frequency, such as at mmWave bands of the 5G NR.

Example RF Transceiver

FIG. 1 is a block diagram illustrating an example RF transceiver 100, in accordance with certain aspects of the present disclosure. The RF transceiver 100 may include co-integration of HEMT-HBT on a silicon substrate, as further described herein with respect to FIG. 2.

The RF transceiver 100 includes at least one transmit (TX) path 102 (also known as a transmit chain) for transmitting signals via one or more antennas 106 and at least one receive (RX) path 104 (also known as a receive chain) for receiving signals via the antennas 106. When the TX path 102 and the RX path 104 share an antenna 106, the paths may be connected with the antenna via an interface 108, which may include any of various suitable RF devices, such as a switch 142, a duplexer, a diplexer, a multiplexer, and the like. The switch 142 may be an RF switch for selecting the TX path 102 or the RX path 104 and include an InP HEMT as further described herein with respect to FIG. 2.

Receiving in-phase (I) or quadrature (Q) baseband analog signals from a digital-to-analog converter (DAC) 110, the TX path 102 may include a baseband filter (BBF) 112, a mixer 114, a phase shifter 116, and a power amplifier (PA) 118. The BBF 112, the mixer 114, the phase shifter 116, and the PA 118 may be included in a semiconductor device such as a radio frequency integrated circuit (RFIC). As examples, the BBF 112 and/or mixer 114 may include CMOS transistors, whereas the PA 118 may include InP HBTs, as further described herein with respect to FIGS. 2 and 4.

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 114 are typically RF signals, which may be phase shifted by the phase shifter 116 and amplified by the PA 118 before transmission by the antenna 106.

The RX path 104 may include a low noise amplifier (LNA) 124, a phase shifter 126, a mixer 128, and a baseband filter (BBF) 130. The LNA 124, the phase shifter 126, the mixer 128, and the BBF 130 may be included in a RFIC, which may or may not be the same RFIC that includes the TX path components. RF signals received via the antenna 106 may be amplified by the LNA 124 and phase shifted by the phase shifter 126, which may prevent or reduce interference from the TX path 102. The mixer 128 mixes the amplified (and phase-shifted) RF signals with a receive local oscillator (LO) signal to convert the RF signal of interest to a different baseband frequency (e.g., downconvert). The baseband signals output by the mixer 128 may be filtered by the BBF 130 before being converted by an analog-to-digital converter (ADC) 132 to digital I or Q signals for digital signal processing. In certain cases, the LNA 124 may be implemented with an InP HEMT, as further described herein with respect to FIG. 2.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 120, which may be buffered or amplified by amplifier 122 before being mixed with the baseband signals in the mixer 114. Similarly, the receive LO may be produced by an RX frequency synthesizer 134, which may be buffered or amplified by amplifier 136 before being mixed with the RF signals in the mixer 128. In certain cases, frequency generation and conversion circuits of the RF transceiver 100 may use an InP HBT due to the phase noise reduction provided by a lower 1/f noise (flicker noise) and a desirable transconductance ($g_m$). For example, the TX frequency synthesizer 120 and/or the RX frequency synthesizer 134 may be implemented with an InP HBT, as further described herein with respect to FIG. 2.

A controller 138 may direct the operation of the RF transceiver 100, such as processing and transmitting signals via the TX path 102 and/or receiving and processing signals via the RX path 104. The controller 138 may be a processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 140 may store data and program codes for operating the RF transceiver 100. In certain cases, the controller 138 and/or memory 140 may include control logic (e.g., CMOS logic), which may include CMOS transistors as further described herein with respect to FIG. 4.

While FIG. 1 provides an RF transceiver as an example application in which certain aspects of the present disclosure may be implemented to facilitate understanding, certain aspects described herein related to a semiconductor device having HEMT-HBT integration may be utilized in any of various other suitable electronic systems or circuits.

Example Metamorphic HEMT-HBT Integration

Figure 2:
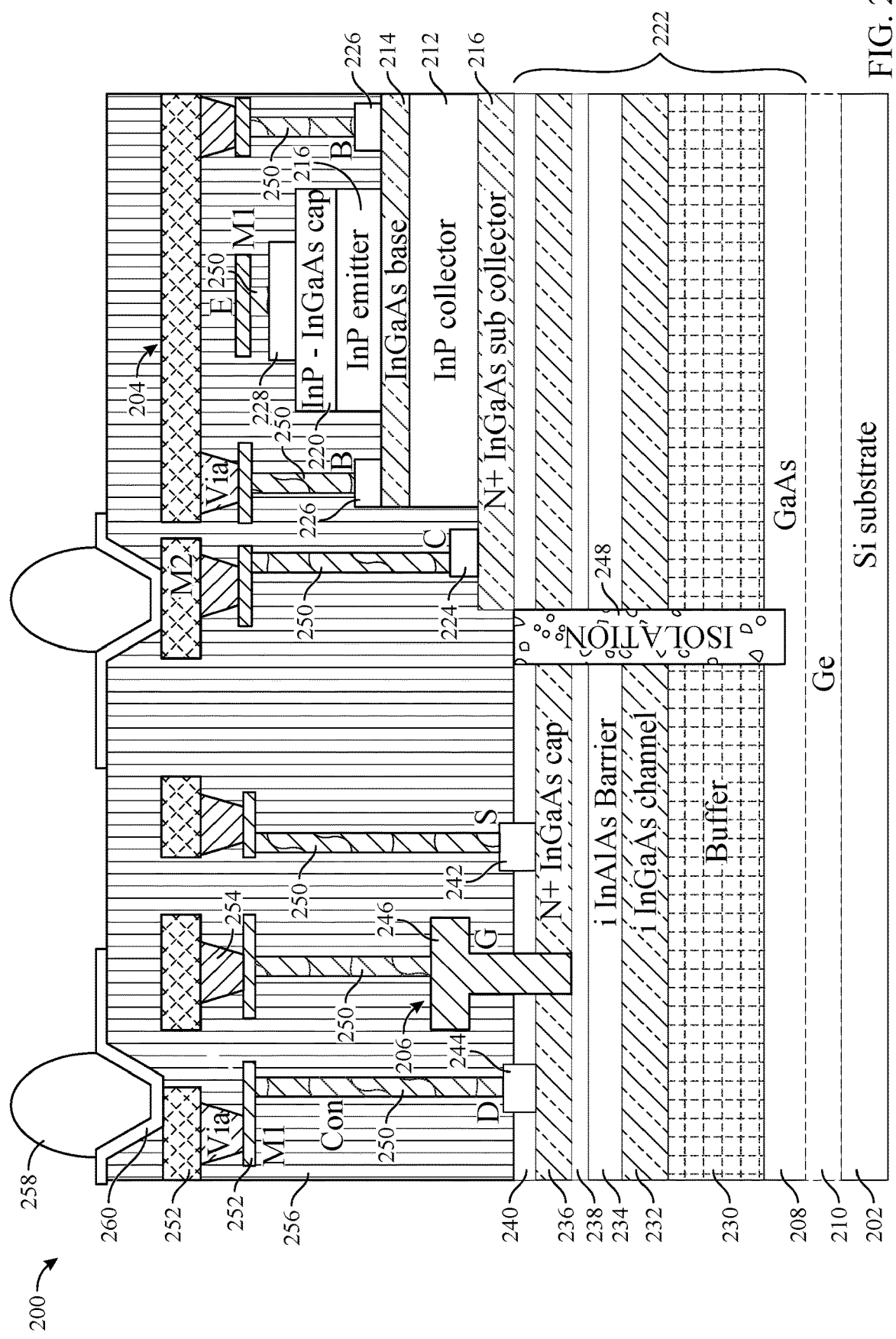
FIG. 2 is a cross-section illustrating an example semiconductor device having a high electron mobility transistor (HEMT) and a heterojunction transistor (HBT) integrated on the same semiconductor substrate, in accordance with certain aspects of the present disclosure.

FIG. 2 is a cross-section illustrating an example semiconductor device 200 that has HEMT-HBT integration on a semiconductor substrate, in accordance with certain aspects of the present disclosure. As shown, the semiconductor device 200 may include a semiconductor substrate 202, a bipolar junction transistor (BJT) 204, and a HEMT 206.

The semiconductor substrate 202 may be, for example, a portion of a semiconductor wafer, such as a silicon wafer. As an example, the semiconductor substrate 202 may be a silicon wafer having a diameter of 300 mm.

In aspects, a semiconductor layer 208 is disposed above the semiconductor substrate 202, where the semiconductor layer 208 is a different type of semiconductor than the semiconductor substrate 202. The semiconductor layer 208 may be any suitable nucleation layer (e.g., a layer of gallium arsenide (GaAs)) that facilitates growth of an indium-based semiconductor structures, such as the BJT 204 and/or the HEMT 206, due to the lattice mismatch between the semiconductor substrate 202 and the indium-based layers.

For example, the semiconductor layer 208 may be a layer of GaAs. The semiconductor layer 208 may facilitate the formation of the BJT 204 and/or the HEMT 206 above, for example, due to lattice matching. In certain cases, the semiconductor layer 208 may be formed above a lattice-matched germanium (Ge) buffer layer 210 (e.g., about 500 nm in height), which may be grown above the semiconductor substrate 202. In aspects, the semiconductor layer 208 may be formed above the Ge buffer layer using a deposition process such as a metal organic chemical vapor deposition (MOCVD). In certain cases, the semiconductor layer 208 may be formed above the semiconductor substrate 202 with an aspect ratio trapping process or nano-ridge merging.

The BJT 204 may be a heterojunction bipolar transistor (HBT) comprising indium. The BJT 204 may be configured for high speed, high voltage applications such as power amplification and phase shifting. For example, a power amplifier (e.g., PA 118 of FIG. 1) may include the BJT 204 to amplify RF signals at high voltages and high frequencies, such as the mmWave band of 5G NR. As another example, a frequency generation and/or conversion circuit (e.g., the TX frequency synthesizer 120 and/or the RX frequency synthesizer 134 of FIG. 1) may include the BJT 204 to generate and/or convert signals at high frequencies, such as the mmWave band, and potentially also at high voltages.

The BJT 204 may comprise a collector layer 212, a base layer 214, and an emitter layer 216. In certain cases, the BJT 204 may further include a sub-collector layer 218 and a cap layer 220. The collector layer 212 may be disposed above the semiconductor substrate 202, the base layer 214 may be disposed above the collector layer 212, and the emitter layer 216 may be disposed above the base layer 214.

The collector layer 212 may comprise indium phosphide (InP), the base layer 214 may include indium gallium arsenide (InGaAs), and the emitter layer 216 may comprise InP. In aspects, the sub-collector layer 218 may be disposed below the collector layer 212 and comprise n+ doped InGaAs. In certain cases, the base layer 214 and/or the sub-collector layer 218 may have an indium composition of 30% to 53%. For example, the base layer 214 and/or the sub-collector layer 218 may have a chemical formula of $In_xGa_{1-x}As$, where x is within a range of 0.3 to 0.53. The cap layer 220 may be disposed above the emitter layer 216 and comprise InP and/or InGaAs In aspects, the BJT 204 may be disposed above the semiconductor substrate 202 on a semiconductor stack structure 222, which may have the same layers as the HEMT 206 as further described herein. That is, the BJT 204 may be disposed above the semiconductor stack structure 222, which is disposed above the semiconductor substrate 202. The semiconductor layer 208 may also be disposed between the semiconductor substrate and the semiconductor stack structure 222.

In aspects, a collector terminal 224 may be disposed above and coupled to the sub-collector layer 218. The collector terminal 224 may be an ohmic contact for the collector of the BJT 204. The collector terminal 224 may include a conductive material such as nickel (Ni), germanium (Ge), aluminum (Al), or a combination thereof.

Base terminals 226 may be disposed above and coupled to the base layer 214. The emitter layer 216 may be disposed between the base terminals 226. The base terminals 226 may be ohmic contacts for the base of the BJT 204. The base terminals 226 may include a conductive material such as platinum (Pt), titanium (Ti), palladium (Pd), or a combination thereof.

An emitter terminal 228 may be disposed above and coupled to the cap layer 220. The emitter terminal 228 may be an ohmic contact for the emitter of the BJT 204. The emitter terminal 228 may include a conductive material such as molybdenum (Mo), tungsten (W), titanium (Ti), titanium tungsten (TiW), or a combination thereof.

The HEMT 206 may be a metamorphic HEMT (mHEMT) comprising indium. The HEMT 206 may be configured for high speed, high voltage applications such as RF switching and/or amplification. For example, a low noise amplifier (e.g., LNA 124 of FIG. 1) may include the HEMT 206 to amplify RF signals at frequencies, for example, in mmWave bands. As another example, an RF switch (e.g., the switch 142 of FIG. 1) may include the HEMT 206 to switch between a TX path and an RX path at high voltages and high frequencies.

The HEMT 206 may include a buffer layer 230, a channel layer 232, a barrier layer 234, and a cap layer 236. In certain cases, the HEMT 206 may further include a first etch stop layer 238 and a second etch stop layer 240. The first etch stop layer 238 may be disposed between the barrier layer 234 and cap layer 236. The second etch stop layer 240 may be disposed above the cap layer 236. The first and second etch stop layers 238, 240 may be used to selectively etch portions of the semiconductor device 200, as further described herein with respect to FIGS. 3A-3H. The first and second etch stop layers 238, 240 may include indium phosphide (InP), for instance.

The buffer layer 230 may be disposed above the semiconductor layer 208. As an example, the buffer layer 230 may include a graded indium aluminum arsenide (InAlAs) buffer, such that the composition of indium may increase from the bottom (e.g., the surface engaged with the semiconductor layer 208) to the top (e.g., the surface engaged with the channel layer 232) of the buffer layer 230 within a certain range, for example, 0.1 to 0.30 for an mHEMT with 30% indium in the channel layer 232 or 0.1 to 0.53 for an mHEMT with 53% indium in the channel layer 232. The buffer layer 230 may have a chemical formula of $In_xAl_{1-x}As$, where x is within a range of 0.1 to 0.30 or 0.1 to 0.53. In aspects, the buffer layer 230 may be a metamorphic transitional buffer layer, such that the buffer layer 230 may reduce strains on the active device layers of the HEMT 206 due to mismatches in thermal expansion coefficients and lattice constants between the InGaAs and other materials, such as the semiconductor substrate 202, semiconductor layer 208, the isolation region 248, or the dielectric layers 256.

The channel layer 232 may be disposed above the buffer layer 230. The channel layer 232 may include indium gallium arsenide (InGaAs), for example. In certain cases, the channel layer 232 may include an undoped or intrinsic InGaAs material. In certain cases, the channel layer 232 may have an indium composition of 30% to 53%. For example, the channel layer 232 may have a chemical formula of $In_xGa_{1-x}As$, where x is within a range of 0.3 to 0.53.

The barrier layer 234 may be disposed above the channel layer 232. The barrier layer 234 may include indium aluminum arsenide (InAlAs). In certain cases, the barrier layer 234 may include an undoped or intrinsic InAlAs material. In certain cases, the barrier layer 234 may have an indium composition of 30% to 53%. For example, the barrier layer 234 may have a chemical formula of $In_xAl_{1-x}As$, where x is within a range of 0.3 to 0.53.

The cap layer 236 may be disposed above the barrier layer 234. The cap layer 236 may include n+ doped indium gallium arsenide (InGaAs), for instance. The barrier layer 234 and cap layer 236 may be configured to enhance the performance of the HEMT 206 for high speed, high voltage applications, such as by increasing the transition frequency and maximum frequency.

The HEMT 206 may also include a source terminal 242, a drain terminal 244, and a gate terminal 246. The source terminal 242 and drain terminal 244 may be disposed above and coupled to the cap layer 236. The gate terminal 246 may intersect a portion of the cap layer 236 such that the gate terminal 246 is disposed above and coupled to the barrier layer 234. The source terminal 242, drain terminal 244, and gate terminal 246 may be ohmic contacts for the HEMT 206. The source and drain terminals 242, 244 may include a conductive material such as nickel (Ni), germanium (Ge), aluminum (Al), or a combination thereof. The gate terminal 246 may include a conductive material such as titanium (Ti), platinum (Pt), gold (Au), or a combination thereof.

In certain cases, an isolation region 248 may be disposed between the BJT 204 and the HEMT 206. For example, the isolation region 248 may separate the various layers of the HEMT 206 from the semiconductor stack structure 222. In aspects, the isolation region 248 may intersect a portion of the semiconductor layer 208. The isolation region 248 may be configured to electrically isolate the BJT 204 and the HEMT 206 from each other and/or other electrical components. The isolation region 248 may be formed using an implantation of doubly charged (ionized) helium (He++), for example.

The semiconductor device 200 may further comprise local conductive interconnects 250, conductive layers 252, and conductive vias 254. The local conductive interconnects 250 may be electrically coupled between the various terminals of the BJT 204 and HEMT 206 and one of the conductive layers 252. The conductive layers 252 may include metal layers (e.g., M1, M2, etc.) formed during a back-end-of-line (BEOL) process. The conductive vias 254 may be conductive pillars coupled between the conductive layers 252, for example. The local conductive interconnects 250, conductive layers 252, and conductive vias 254 may be embedded in one or more dielectric layers 256 disposed above the BJT 204 and HEMT 206. The dielectric layers 256 may be layers of silicon dioxide ($SiO_2$), for example.

In this example, the semiconductor device 200 may be a flip-chip ball grid array (FC-BGA) integrated circuit having multiple solder bumps 258 electrically coupled to conductive pads 260, which may be electrically coupled to at least one of the conductive layers 252. In certain cases, the semiconductor device 200 may have conductive pillars (e.g., copper (Cu) pillars) for electrically coupling the semiconductor device 200 to a package substrate, an interposer, or a circuit board, for example.

In certain aspects, an RF transceiver integrated circuit (e.g., the RF transceiver 100) may include the semiconductor device 200. The RF transceiver integrated circuit (also referred to as an RF Front-End (RFFE) IC) may include a power amplifier (e.g., the PA 118) and/or a frequency generation and/or conversion circuit (e.g., the TX frequency synthesizer 120 and/or the RX frequency synthesizer 134), any of which may include the BJT 204. The RFFE IC may include a switch (e.g., the switch 142) and/or an LNA (e.g., the LNA 124), any of which may include the HEMT 206. In certain cases, the RFFE IC may also include CMOS transistors for various control logic, digital devices, or switches as further described herein with respect to FIG. 4.

FIGS. 3A-3H illustrate example operations for fabricating a semiconductor device that has HEMT-HBT integration on a semiconductor substrate, in accordance with certain aspects of the present disclosure. The operations may be performed by a semiconductor fabrication facility, for example. The operations may include various front-end-of-line (FEOL) fabrication processes, when active electrical devices (e.g., BJT 204 and HEMT 206) are patterned on a substrate (e.g., the semiconductor substrate 202), and/or various back-end-of-line (BEOL) fabrication processes, when passive electrical devices are formed and the various electrical devices are electrically interconnected with local interconnects, conductive layers, and conductive vias.

Figure 3A:
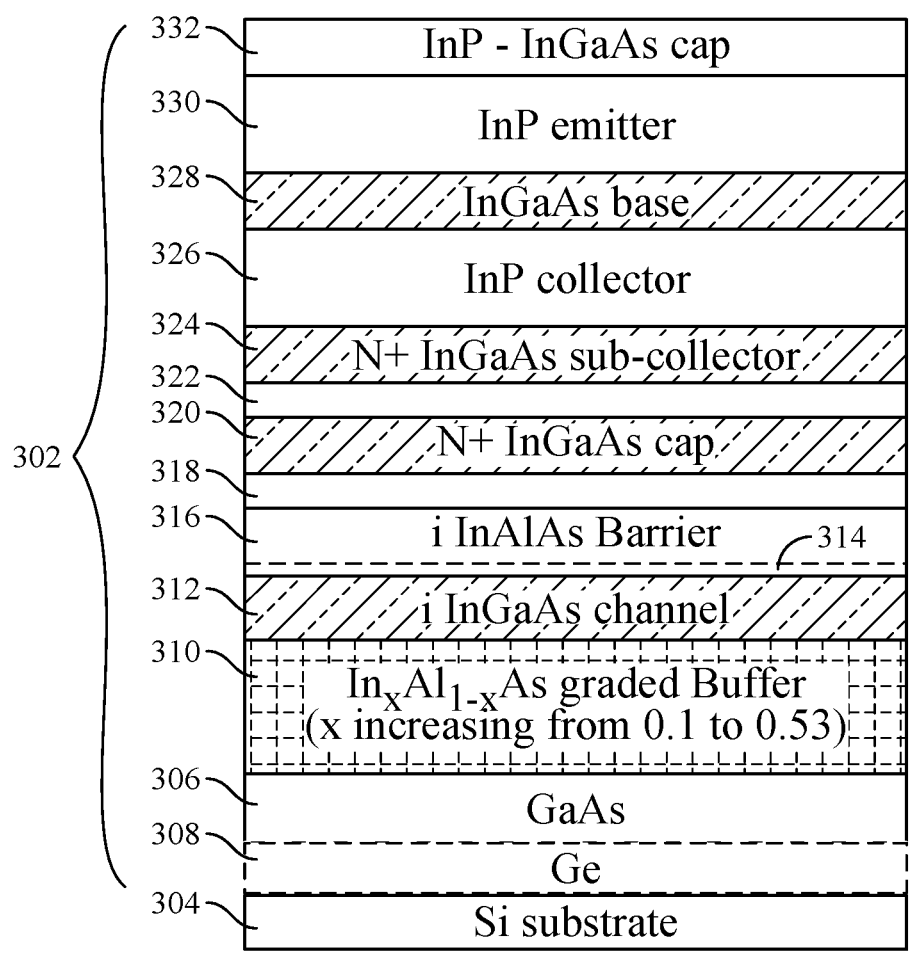
FIGS. 3A-H are cross-sections of example operations for fabricating a semiconductor device with the HEMT and HBT on the same semiconductor substrate, in accordance with certain aspects of the present disclosure.

As shown in FIG. 3A, a semiconductor stack structure 302 may be formed on a semiconductor substrate 304, for example, using an MOCVD process and/or molecular beam epitaxy (MBE) process. The semiconductor stack structure 302 may include a semiconductor layer 306 (e.g., the semiconductor layer 208), and in certain cases, a first buffer layer 308 (e.g., the buffer layer 210). In aspects, the semiconductor stack structure 302 may include indium, such as various layers of InP, InGaAs, or InAlAs. For example, the semiconductor stack structure 302 may also include the various layers of a BJT and a HEMT as described herein with respect to FIG. 2. As an example, the semiconductor stack structure 302 may include a second buffer layer 310 (e.g., the buffer layer 230), a channel layer 312 (e.g., the channel layer 232), a delta doping layer 314, a barrier layer 316 (e.g., the barrier layer 234), a first etch stop layer 318 (e.g., the first etch stop layer 238), a cap layer 320 (e.g., the cap layer 236), a second etch stop layer 322 (e.g., the second etch stop layer 240), a sub-collector layer 324 (e.g., the sub-collector layer 218), a collector layer 326 (e.g., the collector layer 212), a base layer 328 (e.g., the base layer 214), an emitter layer 330 (e.g., the emitter layer 216), and a cap layer 332 (e.g., the cap layer 220), in ascending order from the semiconductor layer 306. The delta doping layer 314 may include a silicon delta doping, for example.

Figure 3B:
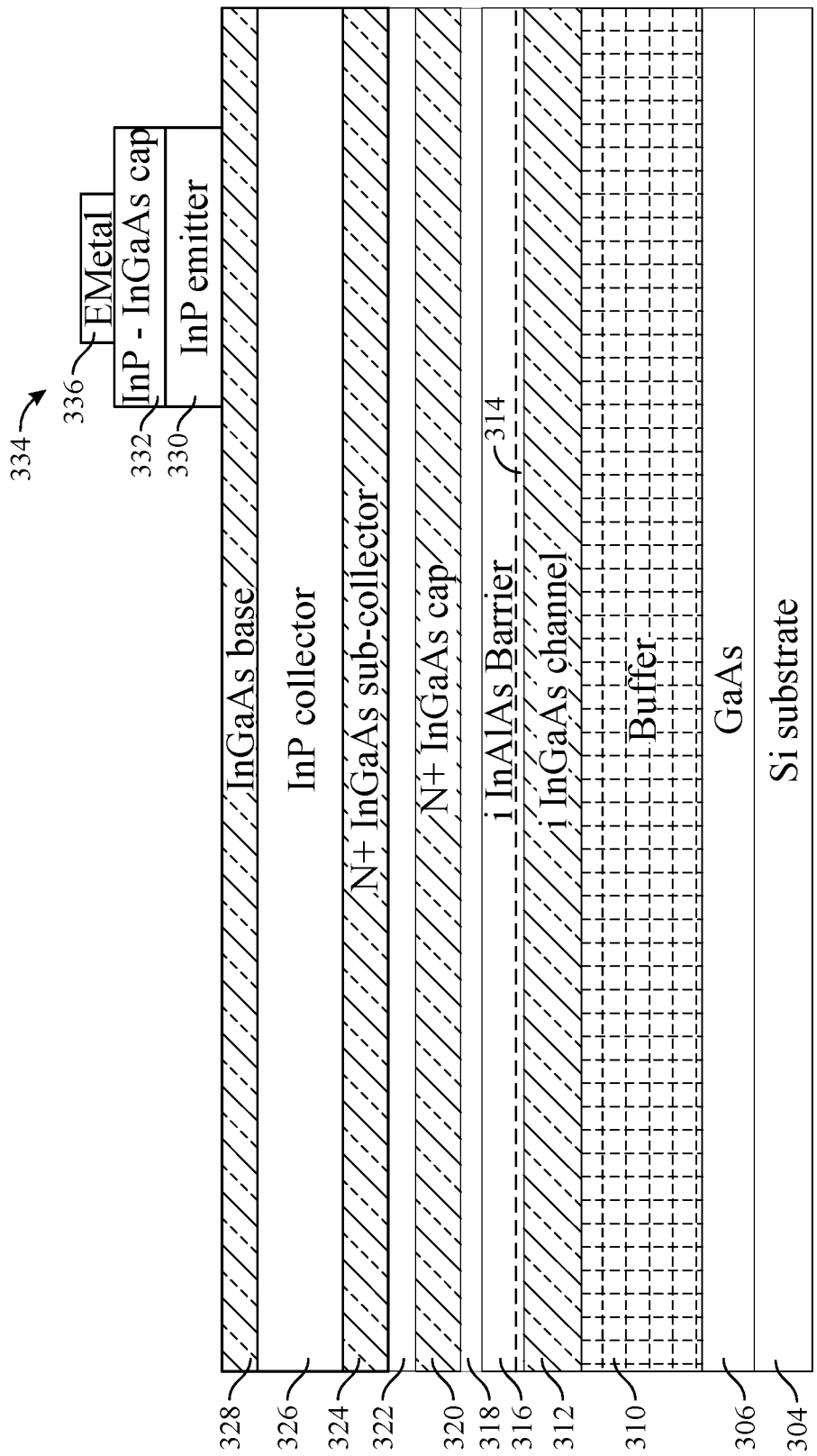

Referring to FIG. 3B, formation of an emitter mesa 334 may be performed, for example, using an etching process, such as various plasma processes (Inductively Coupled Plasma (ICP), Reactive Ion Etching (RIE), or Ion Beam Etching (IBE)). For instance, portions of the emitter layer 330 and cap layer 332 may be removed from the semiconductor stack structure 302 to form the emitter mesa 334. An emitter terminal 336 (e.g., the emitter terminal 228) may be formed on the emitter mesa 334, for example, above the cap layer 332. Nitride passivation (not shown) may be performed on the emitter mesa 334 to prevent surface leakage, high diffusivity, or mobility of impurities.

Figure 3C:
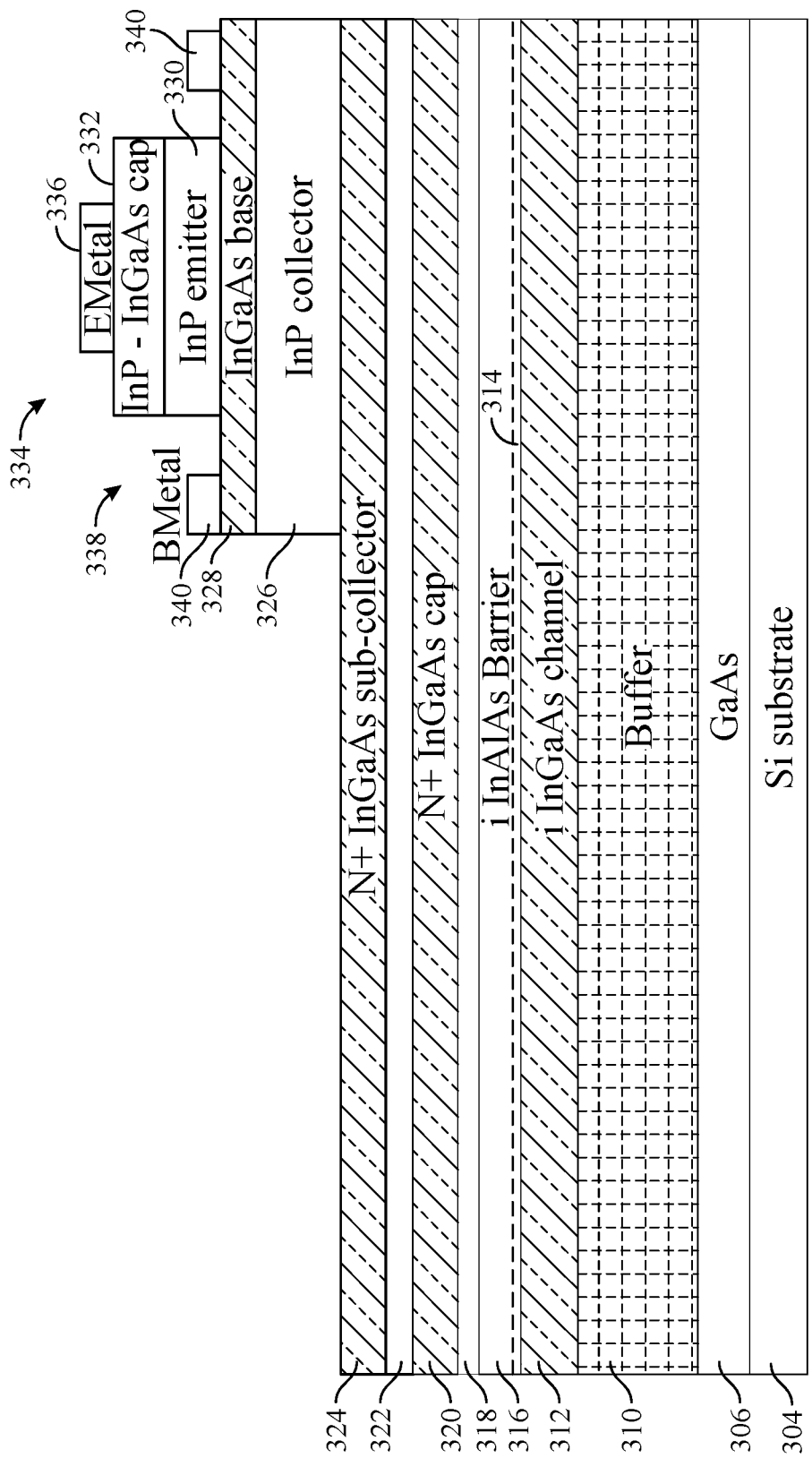

As illustrated in FIG. 3C, formation of a base mesa 338 may be performed, for example, using an etching process. For instance, portions of the collector layer 326 and base layer 328 may be removed from the semiconductor stack structure 302 to form the base mesa 338. Base terminals 340 (e.g., the base terminals 226) may be formed on the base mesa 338, for example, above the base layer 328. In aspects, the emitter mesa 334 may be disposed between the base terminals 340. Nitride passivation (not shown) may be performed on the base mesa 338 to prevent surface leakage, high diffusivity, or mobility of impurities.

Figure 3D:
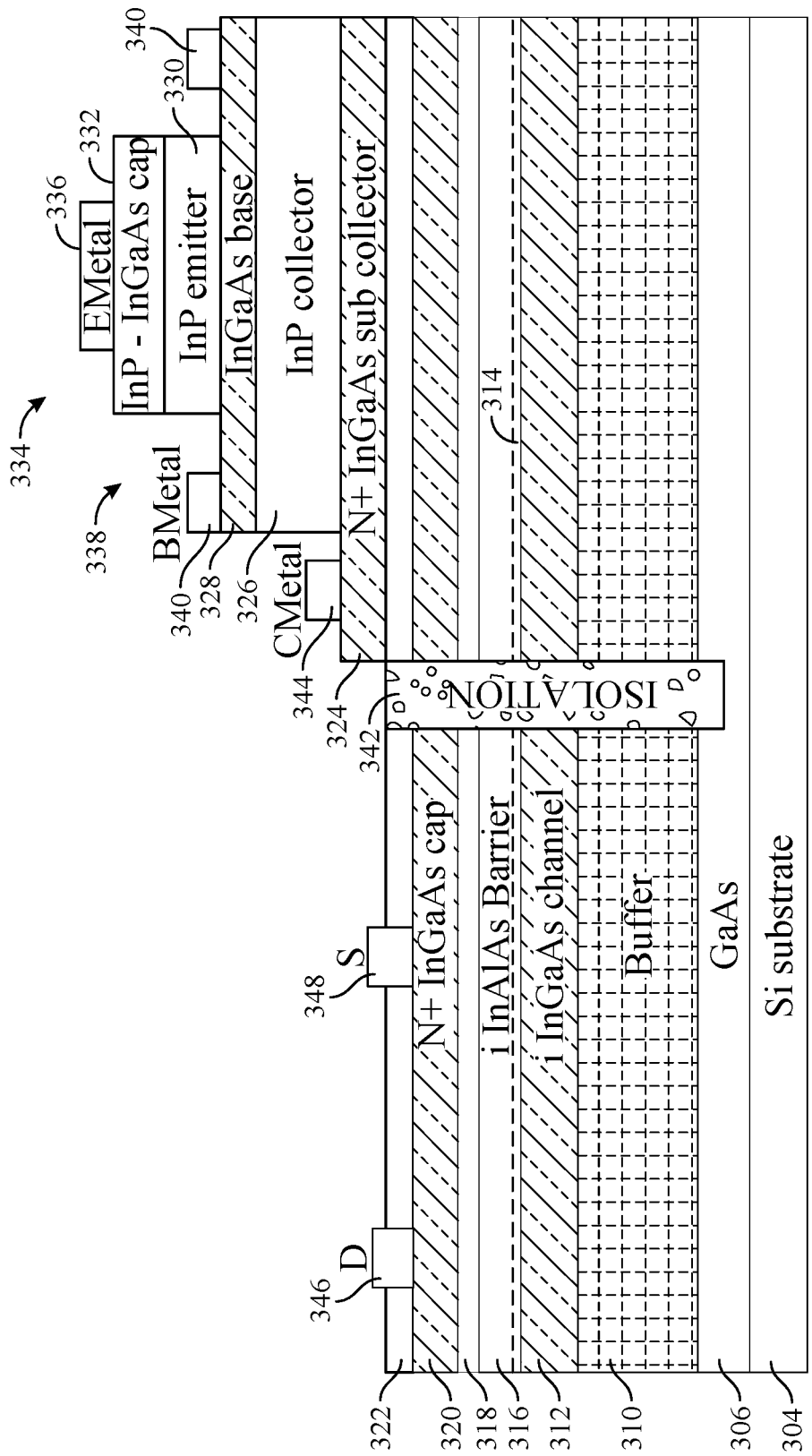

Referring to FIG. 3D, portions of the sub-collector layer 324 may be removed to facilitate formation of the HEMT and isolation region 342 (e.g., the isolation region 248), such that a portion of the sub-collector layer 324 is exposed and adjacent to the base mesa 338. That is, portions of the sub-collector layer 327 may be selectively removed using an etching process to expose a segment of the second etch stop layer 322, which may serve to prevent etching of the cap layer 320. The isolation region 342 may be formed through the various layers of the HEMT, such as the second buffer layer 310, the channel layer 312, the barrier layer 316, the first etch stop layer 318, the cap layer 320, and the second etch stop layer 322. In aspects, the isolation region 342 may be formed using an implantation of doubly charged (ionized) helium (He++), for example.

A collector terminal 344 (e.g., the collector terminal 224), a drain terminal 346 (e.g., the drain terminal 244), and a source terminal 348 (e.g., the source terminal 242) may be formed above the sub-collector layer 324 and cap layer 320, respectively. In aspects, the second etch stop layer 322 may be selectively patterned and etched to provide molds for the drain terminal 346 and source terminal 348. The drain terminal 346 and source terminal 348 may be arranged above the cap layer 320 to facilitate the formation of a gate terminal. Nitride passivation (not shown) may be performed on the exposed portion of the sub-collector layer 324 to prevent surface leakage, high diffusivity, or mobility of impurities.

Figure 3E:
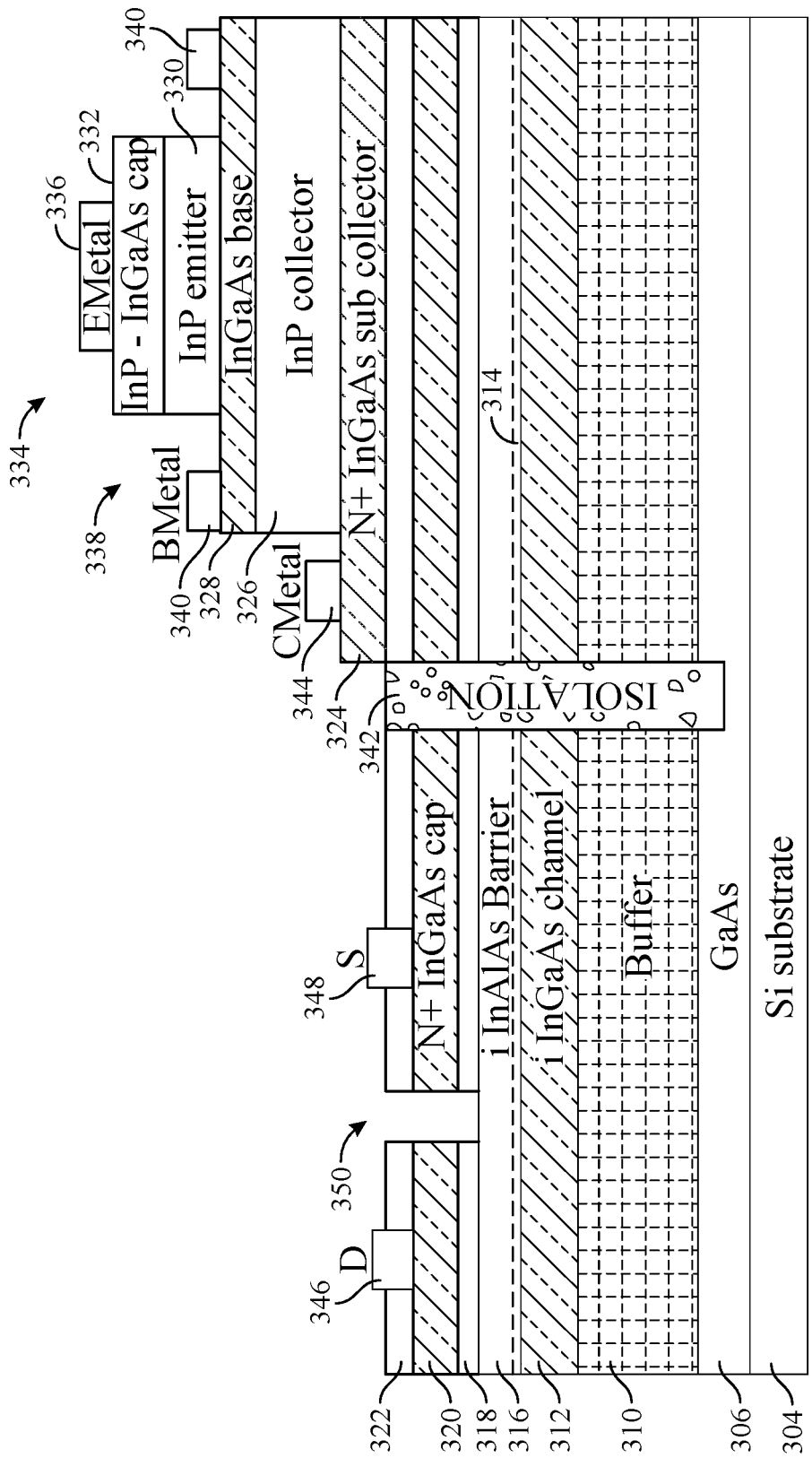

As depicted in FIG. 3E, a cavity 350 may be formed between the drain terminal 346 and source terminal 348 and through the second etch stop layer 322, cap layer 320, and first etch stop layer 318, which may facilitate etching through the cap layer 320 without etching the first etch stop layer 318. For example, a masked etching process may be performed to remove portions of the second etch stop layer 322, cap layer 320, and first etch stop layer 318, where separate etching processes may be used for the cap layer 320 and the first etch stop layer 318. The cavity 350 may expose a portion of the barrier layer 316 and serve as a mold for the gate terminal.

Figure 3F:
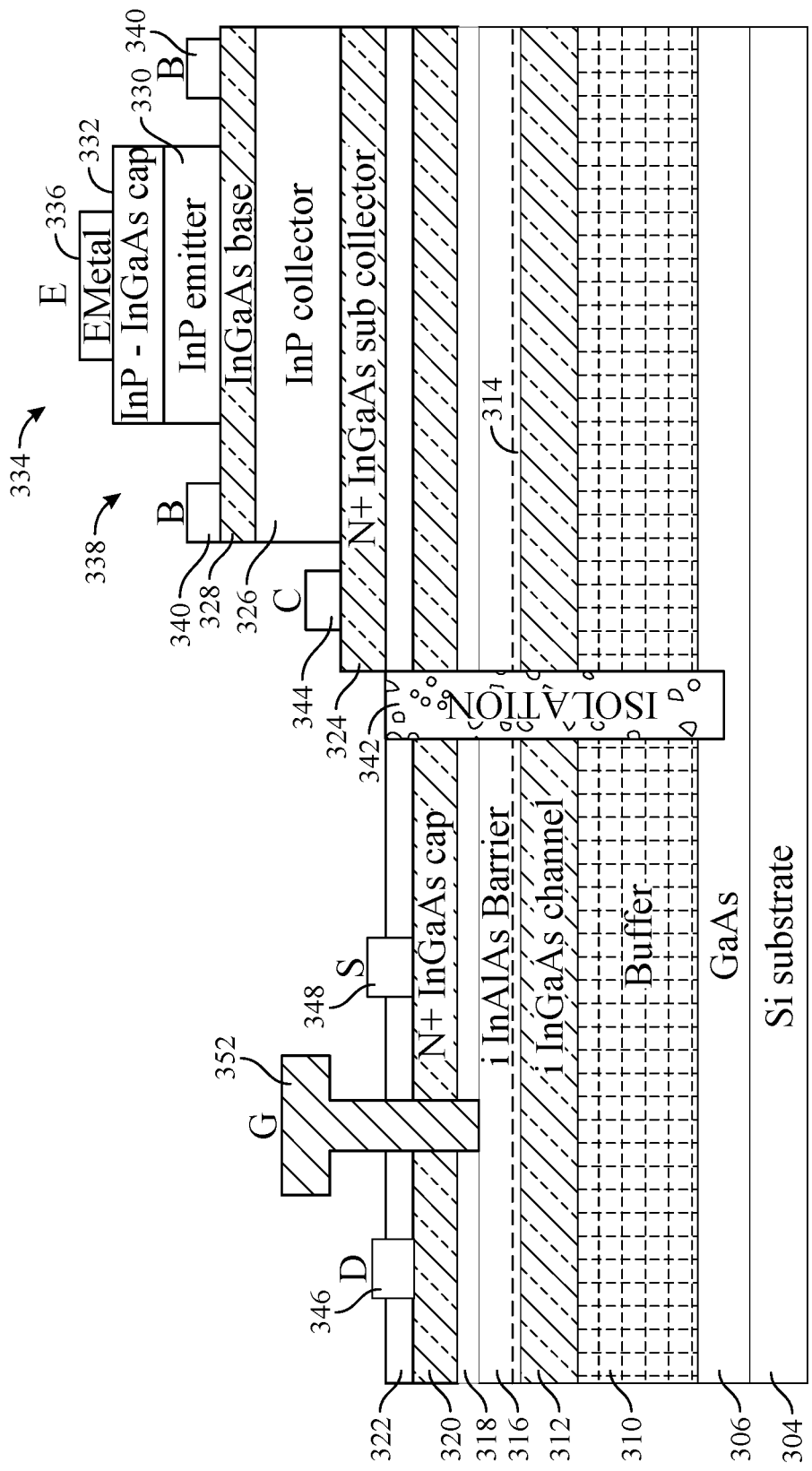

Referring to FIG. 3F, the gate terminal 352 (e.g., the gate terminal 246) may be formed in the cavity 350, and in certain cases, the gate terminal 352 may extend above the drain terminal 346 and source terminal 348.

Figure 3G:
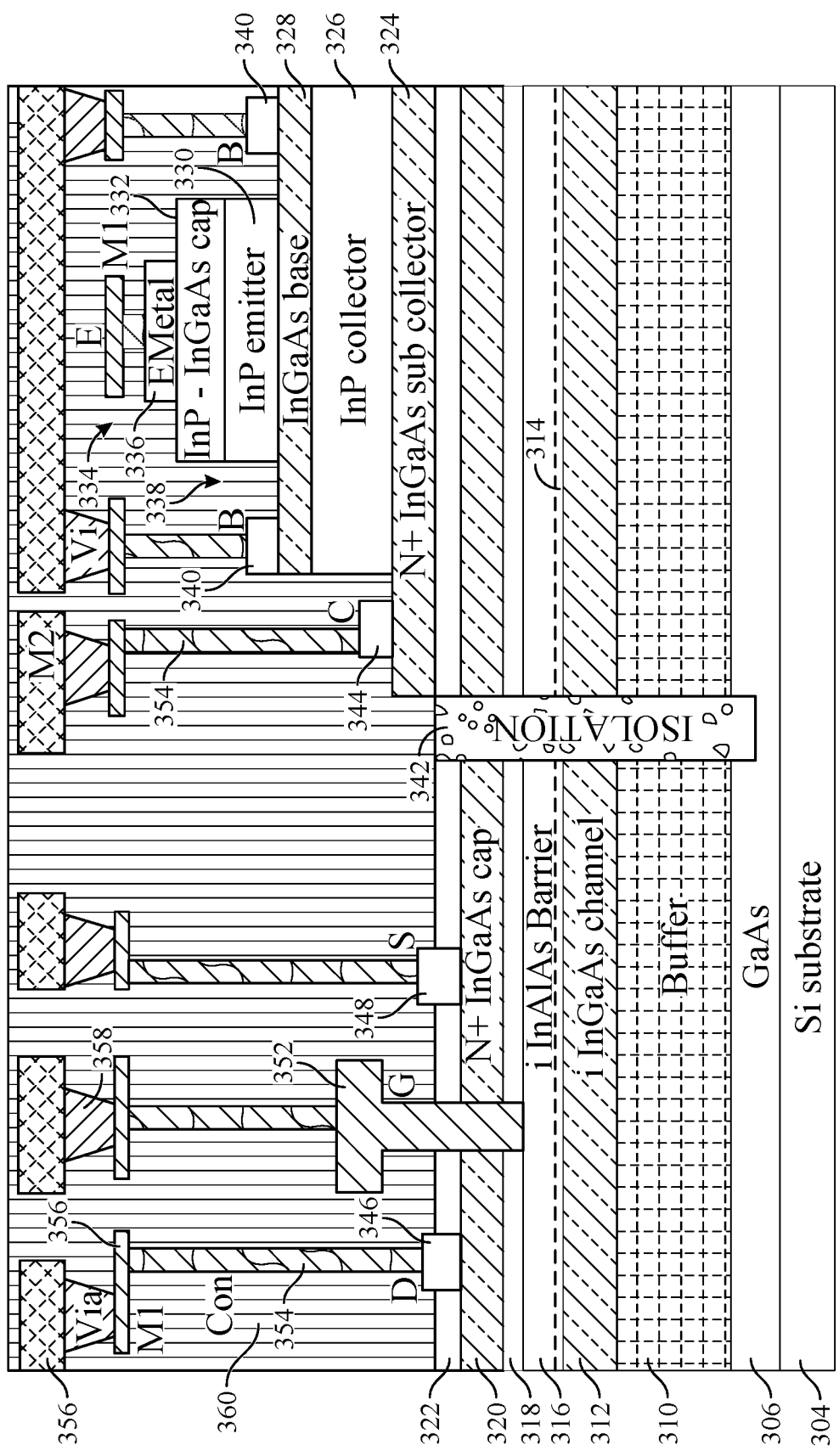

As shown in FIG. 3G, a back-end-of-line (BEOL) fabrication process may be performed to form local conductive interconnects 354 (e.g., the local conductive interconnects 250), conductive layers 356 (e.g., the conductive layers 252), conductive vias 358 (e.g., the conductive vias 254), and one or more dielectric layers 360 (e.g., the dielectric layers 256). In certain cases, a CMOS semiconductor device (not shown) may be disposed above and electrically coupled to the conductive layers 356, for example, via a layer transfer process, as further described herein with respect to FIG. 4.

Figure 3H:
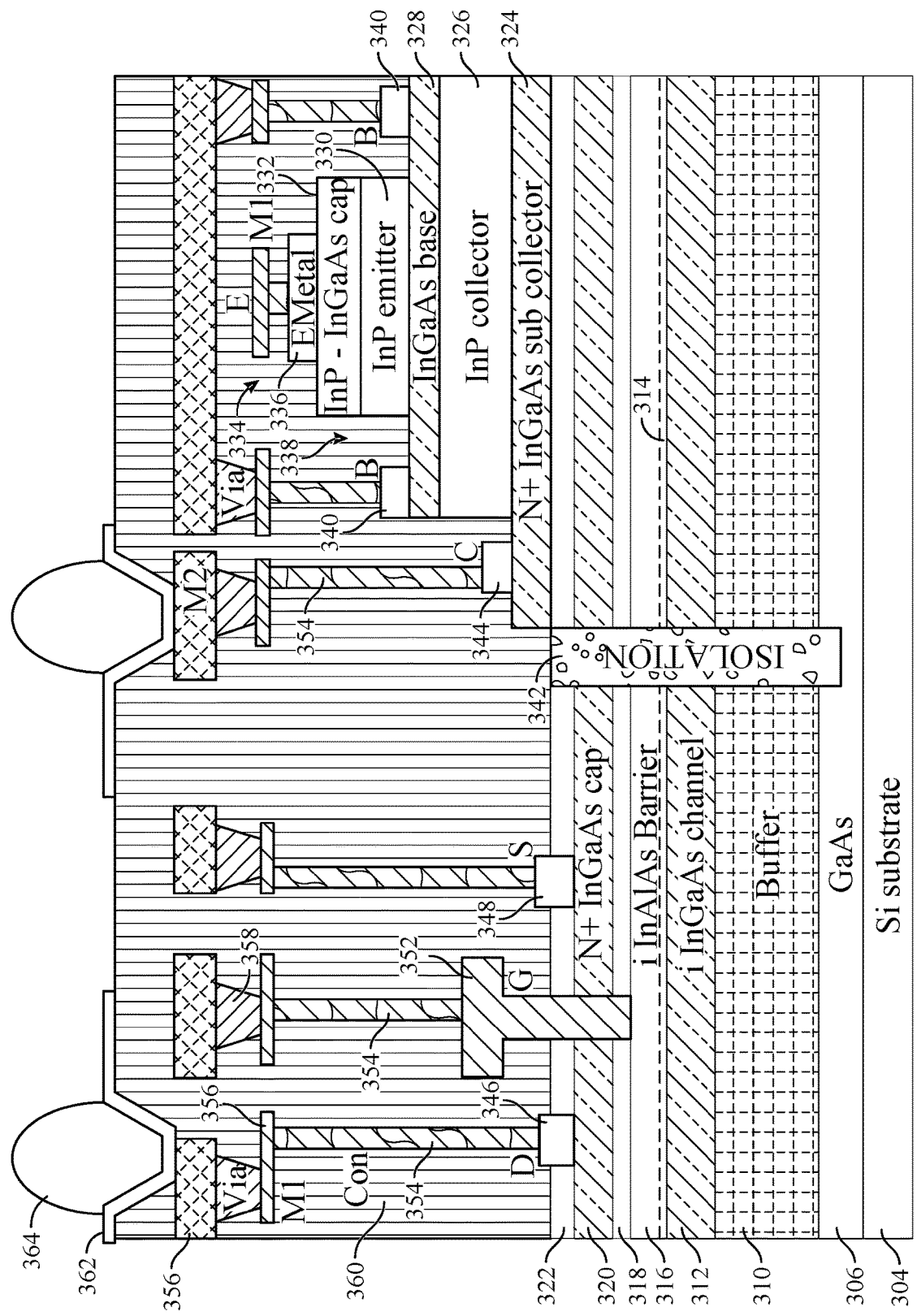

Referring to FIG. 3H, the BEOL fabrication process may be continued by forming conductive pads 362 coupled to one of the conductive layers 356 and solder bumps 364 coupled to the conductive pads 362.

Figure 4:
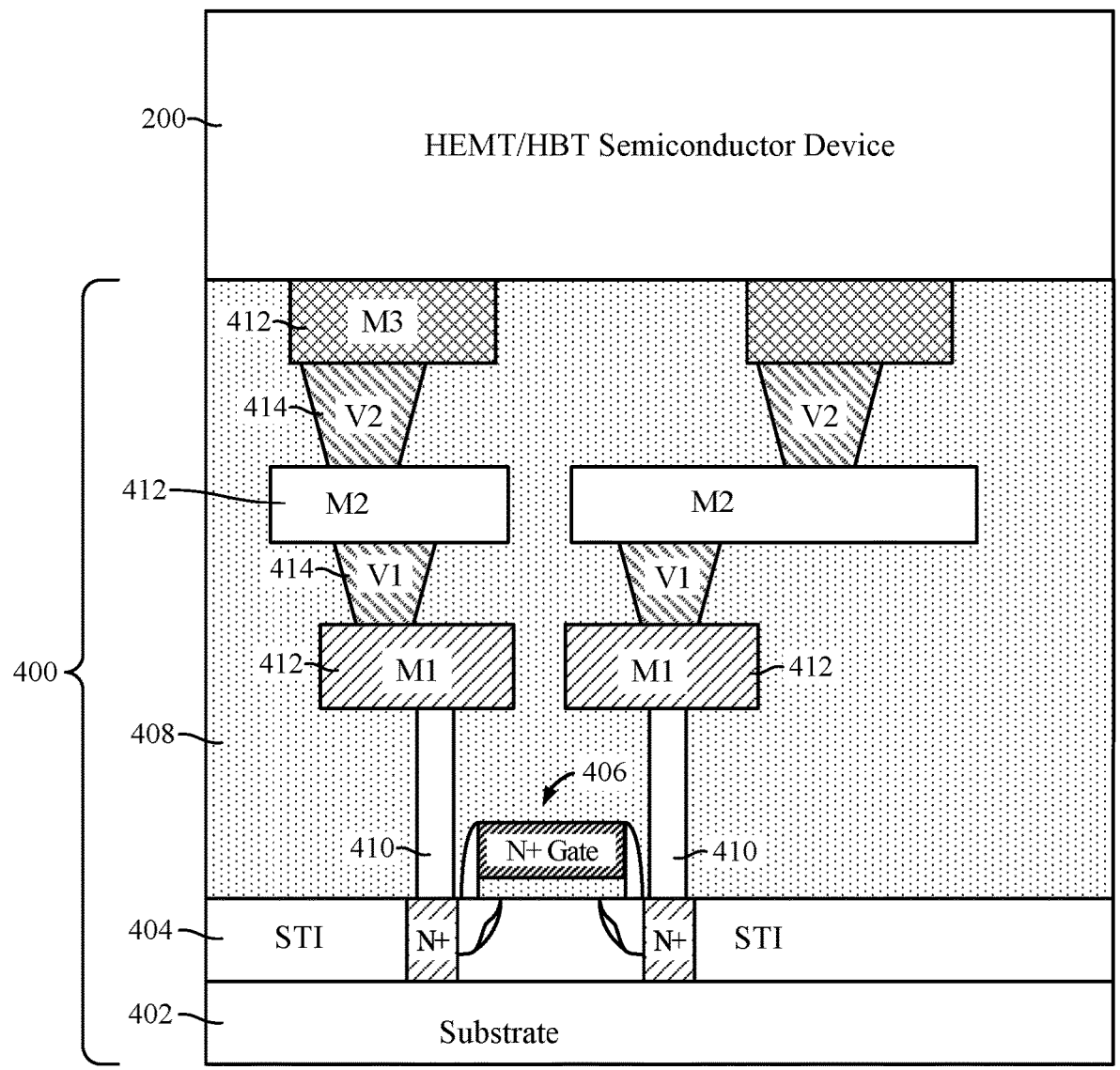
FIG. 4 is a cross-section illustrating a semiconductor device with a silicon-based transistor coupled to the semiconductor device of FIG. 2, in accordance with certain aspects of the present disclosure.

According to certain aspects, the HEMT and HBT may be formed on the silicon substrate, and in certain cases, a CMOS transistor may also be formed on the silicon substrate or disposed above or below the HEMT and HBT via layer transfer. For example, FIG. 4 is a cross-section illustrating a semiconductor device 400 with a CMOS transistor coupled to the semiconductor device 200, in accordance with certain aspects of the present disclosure. As shown, the semiconductor device 200 may be coupled to and disposed above the semiconductor device 400, for example, through a layer transfer process. As an example, the separately processed CMOS semiconductor device 400 may be bonded to the indium-based semiconductor device 200 by a layer transfer bonding processing.

The semiconductor device 400 may include a substrate 402, a dielectric region 404, an active electrical device 406 (e.g., a transistor), dielectric layers 408, local conductive interconnects 410 (e.g., source-drain conductive contacts, which are often abbreviated as CA), conductive layers 412 (e.g., M1, M2, M3, etc.), and conductive vias 414 (e.g., V1, V2, etc.).

The substrate 402 may be, for example, a portion of a semiconductor wafer, such as a silicon wafer. The dielectric region 404 may be disposed above the substrate 402. The dielectric region 404 may comprise an oxide, such as silicon dioxide ($SiO_2$). In aspects, the dielectric region 404 may be a shallow trench isolation (STI) region configured to electrically isolate the active electrical device 406 from other electrical components, such as other electrical devices.

The active electrical device 406 may be disposed above the substrate 402. In this example, the active electrical device 406 may include one or more transistors, such as metal-oxide-semiconductor field-effect transistors (MOS- FETs). In aspects, the MOSFETs may include fin field-effect transistors (finFETs) and/or gate-all-around (GAA) FETs. In certain aspects, the active electrical device 406 may be part of an inverter, amplifier, CMOS logic, and/or other suitable electrical devices comprising transistors. The local conductive interconnects 410 may be electrically coupled to the active electrical device 406. For example, the source and/or drain of the active electrical device 406 may be electrically coupled to the local conductive interconnects 410, which are electrically coupled to the conductive layers 412. In certain aspects, the active electrical device 406 (and the local interconnects 410) may be formed during a front-end-of-line (FEOL) fabrication process.

The conductive layers 412 and conductive vias 414 may be disposed above electrical components (e.g., the active electrical device 406) and formed during a back-end-of-line (BEOL) fabrication process of the semiconductor device 400. In aspects, the conductive layers 412 and conductive vias 414 may be embedded in the dielectric layers 408. The dielectric layers 408 may comprise an oxide, such as silicon dioxide. The conductive layers 412 and conductive vias 414 provide electrical routing between the active electrical device 406 and other electrical components (not shown), including, for example, capacitors, inductors, resistors, an integrated passive device, a power management integrated circuit (PMIC), a memory chip, etc. In aspects, a layer of the conductive layers 412 may be exposed and coupled to the semiconductor device 200 to facilitate electrical coupling between the semiconductor device 200 and semiconductor device 400.

Figure 5:
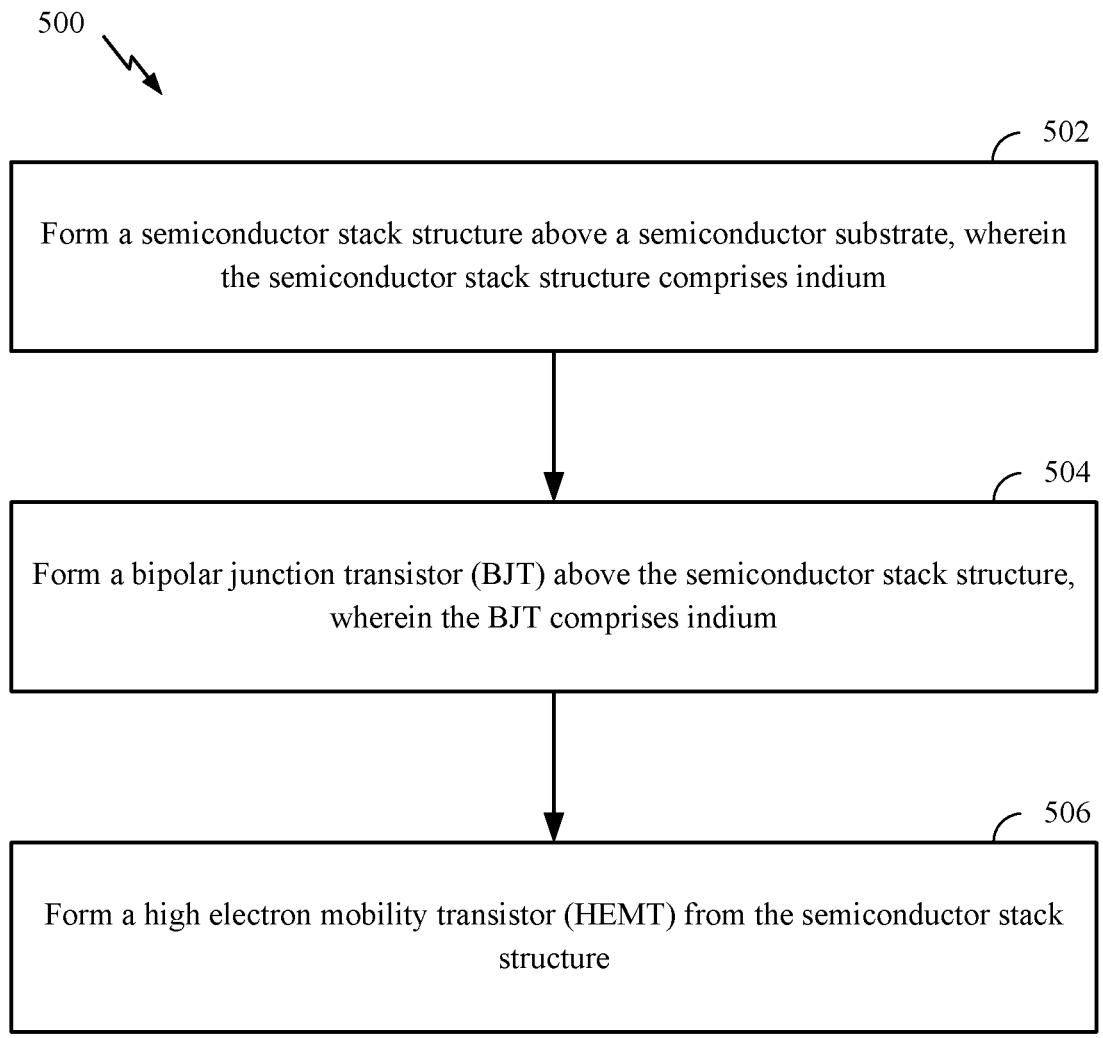
FIG. 5 is a flow diagram illustrating example operations for fabricating a semiconductor device, in accordance with certain aspects of the present disclosure.

FIG. 5 is a flow diagram of example operations 500 for fabricating a semiconductor device (e.g., the semiconductor device 200 of FIG. 2), in accordance with certain aspects of the present disclosure. The operations 500 may be performed by a semiconductor fabrication facility, for example. In certain aspects, the semiconductor device may be an RF transceiver integrated circuit (e.g., the RF transceiver 100).

The operations 500 begin, at block 502, by forming a semiconductor stack structure (e.g., a portion of the semiconductor stack structure 302 corresponding to the layers of the HEMT, the semiconductor layer 306, and in certain cases, the first buffer layer 308) above a semiconductor substrate (e.g., the semiconductor substrate 304). In aspects, the semiconductor stack structure may include indium, such as various layers of InP, InGaAs, or InAlAs described herein with respect to FIGS. 2 and 3A. At block 504, a bipolar junction transistor (BJT) (e.g., the BJT 204) may be formed above the semiconductor stack structure, where the BJT comprises indium. At block 506, a high electron mobility transistor (HEMT) (e.g., the HEMT 206) may be formed from the semiconductor stack structure.

In aspects, the BJT may be formed at block 504 as described herein with respect to FIGS. 3A-3D. For example, the semiconductor stack structure may be extended to form a sub-collector layer (e.g., the sub-collector layer 324), a collector layer (e.g., the collector layer 326), a base layer (e.g., the base layer 328), an emitter layer (e.g., the emitter layer 330), and a cap layer 332 (e.g., the cap layer 332) above an etch stop layer (e.g., the second etch stop layer 322) of the semiconductor stack structure. In aspects, an emitter mesa (e.g., the emitter mesa 334) may be formed from the emitter layer and cap layer of the extended semiconductor stack structure, for example, as described herein with respect to FIG. 3B. A base mesa (e.g., the base mesa 338) may be formed from the base layer and collector layer of the extended semiconductor stack structure, for example, as described herein with respect to FIG. 3C. A portion of the sub-collector layer of the extended semiconductor stack structure may be removed, for example, as described herein with respect to FIG. 3D. Conductive terminals (ohmic contacts) for the emitter, base, and collector may be formed above the cap layer, base layer, and sub-collector layer, respectively.

In aspects, an isolation region (e.g., the isolation region 342) may be formed between the BJT and HEMT. For example, the operations 500 may include forming the isolation region intersecting the semiconductor stack structure and between the BJT and the HEMT. In aspects, the isolation region may be formed by implanting ionized helium into a portion of the semiconductor stack structure.

In aspects, the HEMT may be formed at blocks 502, 506 from the semiconductor stack structure as described herein with respect to FIGS. 3D-3F. For example, forming the semiconductor stack structure at block 502 may include forming a buffer layer (e.g., the second buffer layer 310), a channel layer (e.g., the channel layer 312), a delta doping layer (e.g., the delta doping layer 314), a barrier layer (e.g., the barrier layer 316), a first etch stop layer (e.g., the first etch stop layer 318), a cap layer (e.g., the cap layer 320), and a second etch stop layer (e.g., the second etch stop layer 322) above the semiconductor substrate. A cavity (e.g., the cavity 350) may be formed through the second etch stop layer, the cap layer, and the first etch stop layer. Source and drain terminals may be formed above and coupled to the cap layer, and a gate terminal may be formed in the cavity coupled to the barrier layer.

In aspects, the operations 500 may further include various BEOL fabrication processes, such as forming local conductive interconnects, conductive layers (e.g., layers of embedded traces), and conductive vias embedded in dielectric layers disposed above the BJT and HEMT, for example, as described herein with respect to FIGS. 3G and 3H. In aspects, the operations 500 may further include coupling a semiconductor device with CMOS devices to the semiconductor device with the HEMT and BJT, for example, via a layer transfer process.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A semiconductor device, comprising:
a semiconductor substrate, wherein the semiconductor substrate comprises silicon;
a bipolar junction transistor (BJT) disposed above the semiconductor substrate and comprising indium phosphide; and
a high electron mobility transistor (HEMT) disposed above the semiconductor substrate and comprising indium.

2. The semiconductor device of claim 1, wherein the BJT is a heterojunction bipolar transistor (HBT).

3. The semiconductor device of claim 2, wherein the HBT further comprises:
a collector layer comprising indium phosphide;
an emitter layer comprising indium phosphide; and
a base layer comprising indium gallium arsenide.

4. The semiconductor device of claim 3, wherein:
the collector layer is disposed above the semiconductor substrate;
the base layer is disposed above the collector layer; and
the emitter layer is disposed above the base layer.

5. The semiconductor device of claim 4, wherein the HBT further comprises a sub-collector layer disposed below the collector layer and comprising indium gallium arsenide.

6. The semiconductor device of claim 5, wherein:
the sub-collector layer has an indium composition of 30% to 53%; and
the base layer has an indium composition of 30% to 53%.

7. The semiconductor device of claim 1, wherein the HEMT is a metamorphic HEMT.

8. The semiconductor device of claim 1, wherein the HEMT further comprises:
a buffer layer disposed above the semiconductor substrate; and
a channel layer disposed above the buffer layer.

9. The semiconductor device of claim 8, wherein the HEMT further comprises:
a barrier layer disposed above the channel layer; and
a cap layer disposed above the barrier layer.

10. The semiconductor device of claim 9, wherein:
the buffer layer comprises indium aluminum arsenide;
the channel layer comprises indium gallium arsenide;
the barrier layer comprises indium aluminum arsenide; and
the cap layer comprises indium gallium arsenide.

11. The semiconductor device of claim 10, wherein:
the buffer layer comprises indium aluminum arsenide having a chemical formula of $In_xAl_{1-x}As$;
x is within a range of 0.1 to 0.53;
the channel layer has an indium composition of 30% to 53%; and
the barrier layer has an indium composition of 30% to 53%.

12. The semiconductor device of claim 9, further comprising:
an isolation region disposed between the BJT and the HEMT; and
a semiconductor layer disposed between the semiconductor substrate and the buffer layer, wherein the BJT is disposed above the cap layer.

13. A radio frequency front-end (RFFE) integrated circuit (IC) comprising the semiconductor device of claim 1, wherein a power amplifier of the RFFE IC includes the BJT, and wherein a low noise amplifier of the RFFE IC includes the HEMT.

14. A method of fabricating a semiconductor device, comprising:
forming a semiconductor stack structure above a semiconductor substrate, wherein the semiconductor substrate comprises silicon and wherein the semiconductor stack structure comprises indium;
forming a bipolar junction transistor (BJT) above the semiconductor stack structure, wherein the BJT comprises indium phosphide; and
forming a high electron mobility transistor (HEMT) from the semiconductor stack structure.

15. The method of claim 14, wherein the forming the semiconductor stack structure comprises forming a buffer layer, a channel layer, a barrier layer, and a cap layer above the semiconductor substrate.

16. The method of claim 15, wherein:
the buffer layer is formed above the semiconductor substrate and comprises indium aluminum arsenide;
the channel layer is formed above the buffer layer and comprises indium gallium arsenide;
the barrier layer is formed above the channel layer and comprises indium aluminum arsenide; and
the cap layer is formed above the barrier layer and comprises indium gallium arsenide.

17. The method of claim 15, wherein the forming the BJT comprises forming a collector layer, a base layer, and an emitter layer above the semiconductor stack structure.

18. The method of claim 15, wherein:
the BJT comprises a collector layer, a base layer, and an emitter layer;
the collector layer is formed above the semiconductor stack structure and comprises indium phosphide;
the base layer is formed above the collector layer and comprises indium gallium arsenide; and
the emitter layer is formed above the base layer and comprises indium phosphide.

19. The method of claim 15, further comprising forming an isolation region intersecting the semiconductor stack structure and between the BJT and the HEMT.

20. A semiconductor device comprising:
a semiconductor substrate;
a bipolar junction transistor (BJT) disposed above the semiconductor substrate and comprising indium phosphide; and
a high electron mobility transistor (HEMT) disposed above the semiconductor substrate and comprising indium, wherein the BJT is a heterojunction bipolar transistor (HBT) and wherein the HBT further comprises:
 a collector layer disposed above the semiconductor substrate and comprising indium phosphide;
 a base layer disposed above the collector layer and comprising indium gallium arsenide; and
 an emitter layer disposed above the base layer and comprising indium phosphide.

* * * * *